United States Patent
Oyama et al.

(10) Patent No.: US 6,437,718 B1
(45) Date of Patent: Aug. 20, 2002

(54) CONTINUOUS TIME DELTA-SIGMA MODULATOR

(75) Inventors: Bert K. Oyama, Torrance; William M. Skones, Manhattan Beach, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/605,810

(22) Filed: Jun. 28, 2000

(51) Int. Cl.[7] .......................... H03M 3/00; H03M 1/12
(52) U.S. Cl. ......................................... 341/143; 341/155
(58) Field of Search ................................ 341/143, 155, 341/118, 159, 161, 144, 138; 455/326; 327/220; 330/252

(56) References Cited

U.S. PATENT DOCUMENTS

| | | | | |
|---|---|---|---|---|
| 3,886,531 A | * | 5/1975 | McNeill | 327/220 |
| 4,866,261 A | * | 9/1989 | Pace | 341/138 |
| 4,939,516 A | * | 7/1990 | Early | 341/143 |
| 4,940,981 A | * | 7/1990 | Naylor et al. | 341/161 |
| 5,307,067 A | * | 4/1994 | Kimura et al. | 341/159 |
| 5,379,039 A | * | 1/1995 | Charaska et al. | 341/138 |
| 5,392,042 A | * | 2/1995 | Pellon | 341/143 |
| 5,614,903 A | * | 3/1997 | Oyama | 341/118 |
| 5,684,482 A | * | 11/1997 | Galton | 341/144 |
| 5,959,562 A | * | 9/1999 | Wiesbauer | 341/143 |
| 5,973,561 A | * | 10/1999 | Heaton | 330/252 |
| 6,018,262 A | * | 1/2000 | Noro et al. | 327/328 |
| 6,078,802 A | * | 6/2000 | Kobayashi | 455/326 |

* cited by examiner

Primary Examiner—Peguy JeanPierre
Assistant Examiner—Jean B Jeanglaude
(74) Attorney, Agent, or Firm—Harness, Dickey & Pierce, P.L.C.

(57) ABSTRACT

An analog-to-digital converter (170) that employs delta-sigma technology, and has particular use in a receiver for a wireless telecommunications system. The converter (170) includes a delta-sigma modulator (172), having a summing junction (180) that receives the analog input signal to be converted. A feedback from the output of a comparator (186) is subtracted from the analog input signal to generate a difference signal that is then filtered, amplified and applied to the comparator (186) for digital conversion. A sample and hold circuit (184) receives the difference signal and holds the signal for a predetermined period of time so that the input to the comparator (186) is stable. A differential limiting amplifier (188) is employed to make the high data rate output of the comparator (186) stable. The differential limiting amplifier (188) can be within the comparator (186) itself, or in the feedback path. In one embodiment, the differential amplifier (188) employs a Schottky diode clamp (226).

10 Claims, 10 Drawing Sheets

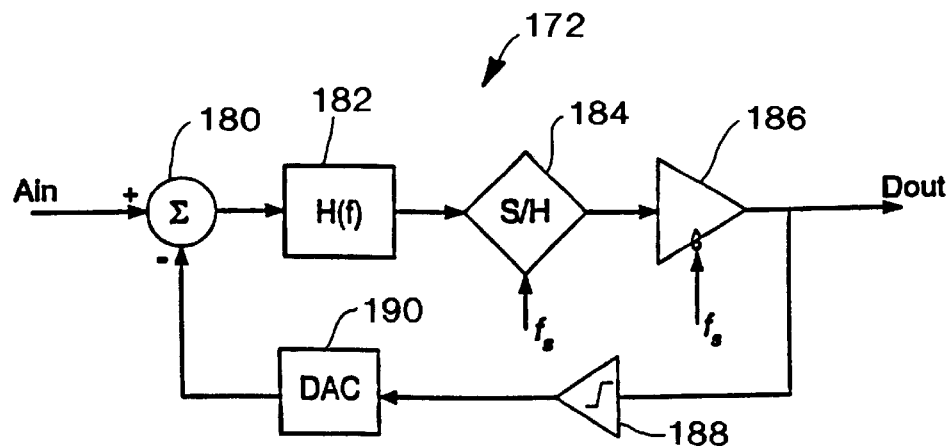
FIG. 7
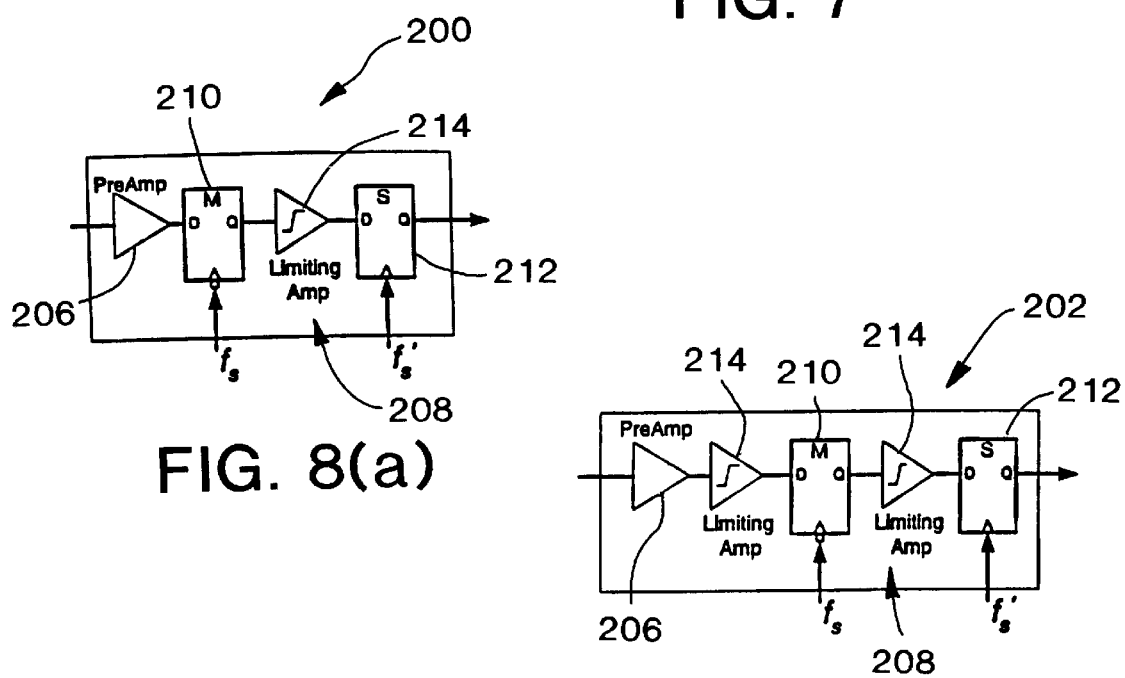
FIG. 8(a)
FIG. 8(b)
FIG. 8(c)

US 6,437,718 B1

CONTINUOUS TIME DELTA-SIGMA MODULATOR

BACKGROUND OF THE INVENTION

1. Field of the Invention

This invention relates generally to an analog-to-digital converter employing a delta-sigma modulator and, more particularly, to an analog-to-digital converter employing a delta-sigma modulator that incorporates a sample and hold circuit and differential limiting amplifiers to increase converter performance.

2. Discussion of the Related Art

Wireless telecommunications systems, particularly cellular telephone communications systems, employ strategically placed base stations having transceivers that receive and transmit signals over a particular carrier frequency band to provide wireless communications between two parties. Depending on the particular area, each base station will include a certain number of receivers that receive the signals, and provide digital signal processing so that the signal is transmitted to the desired destination. Each receiver scans the frequency band of interest until it locks onto a signal in that band. The frequency band is usually at about 800 MHz and higher with a bandwidth of 200 KHz or more. An example with a bandwidth of 75 MHz centered at about 1750 MHz will be used in this description.

A typical receiver for this application will include an antenna that receives the signals and a duplexer that limits the received signals to the desirable carrier frequency range in which the signals are transmitted. The frequency band limited signal received by the antenna is then applied to a low noise amplifier (LNA) where it is amplified to an amplitude suitable for subsequent processing. The band limited and amplified signal is then applied to a frequency down-converter that mixes the received signal with a local oscillator (LO) signal to generate a lower intermediate frequency (IF) signal that can be readily processed by the DSP devices. A bandpass filter (BPF) is typically employed in the frequency down-converter to limit the IF signal to the particular frequency band of the received signal. The filtered IF signal is then applied to an analog-to-digital converter (ADC) that converts the IF signal to a representative digital signal that is then processed by the DSP devices. The receiver may be designed to process signals for many protocols and standards, including time division multiple access (TDMA), code division multiple access (CDMA), enhanced data rate for global evolution (EDGE), Gaussian minimal shift keying (GMSK), etc., depending on the particular application.

The known receiver described above for wireless telecommunications has only been capable of processing a single signal or a single channel at any given time. Thus, a separate receiver has been required in the base station for each separate signal being processed. Because certain base stations may have to receive and transmit many signals for multiple users simultaneously, these base stations must include enough receivers to satisfy this requirement, or service is lost. Because each receiver includes the various components that perform the signal receiving operation discussed above, high traffic base stations include a large amount of receiver hardware, and thus are costly. As cellular telephone communications increases, base stations will be required to provide more simultaneous access, or more base stations will be required, thus significantly increasing costs in these systems.

What is needed is a wireless telecommunications system receiver that operates over a relatively wide bandwidth, and is capable of processing multiple signals in different frequency bands simultaneously. To process multiple signals simultaneously, the basic components, including the LNA, the frequency down-converter and the ADC, of the receiver need to be redesigned to provide the performance specifications and requirements necessary. Compared to the single channel receiver previously mentioned, the multiple channel receiver must continuously handle a much wider range of frequencies and larger range of power levels. In addition, the multiple channel receiver must be insensitive to potential cross-channel interference. It is therefore an object of the present invention to provide such a receiver having high performance components.

SUMMARY OF THE INVENTION

In accordance with the teachings of the present invention, an analog-to-digital converter is disclosed that employs delta-sigma technology, and has particular use in a receiver for a wireless telecommunications system. The converter includes a delta-sigma modulator including a summing junction that receives the analog input signal to be converted. A feedback from the output of a comparator is subtracted from the analog input signal to generate a difference signal that is then filtered, amplified and applied to the comparator for digital conversion. A sample and hold circuit receives the difference signal and holds the signal for a predetermined period of time so that the input to the comparator is stable. A differential limiting amplifier is employed to make the high data rate output of the comparator stable. The differential amplifier can be within the comparator itself, or in the feedback path. In one embodiment, the differential amplifier employs a Schottky diode clamp.

Additional objects, advantages and features of the present invention will become apparent from the following description and appended claims, taken in conjunction with the accompanying drawings.

BRIEF DESCRIPTION OF THE DRAWINGS

FIG. 7 is a detailed block diagram of the delta-sigma modulator used in the analog-to-digital converter shown in FIG. 6;

FIGS. 8(a)–8(c) are block diagrams showing different embodiments of a comparator that can be employed in the delta-sigma modulator shown in FIG. 7, and including a limiting amplifier, according to the invention;

DETAILED DESCRIPTION OF THE PREFERRED EMBODIMENT

The following discussion of the preferred embodiments directed to a receiver, and its components, for a wireless telecommunications system that is capable of processing multiple cellular signals simultaneously is merely exemplary in nature, and is in no way intended to limit the invention or its applications or uses. Particularly, the receiver disclosed herein may be applicable for other wireless communication systems besides cellular communications systems, and the particular components disclosed herein may be applicable for other systems and applications.

Figure 1:
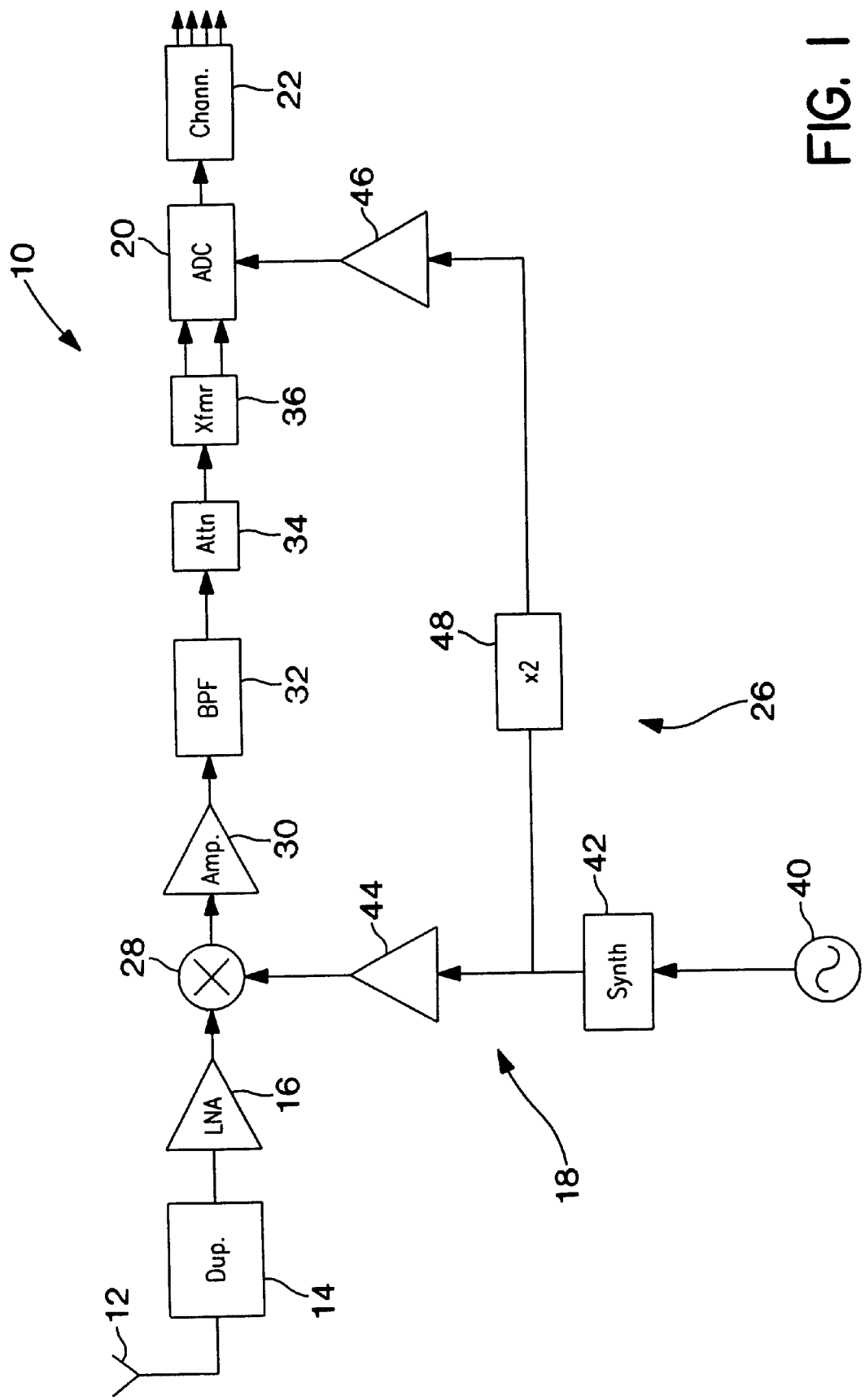
FIG. 1 is a block diagram of a receiver for a telecommunications system capable of processing multiple signals simultaneously, and employing a single frequency down-conversion process, according to an embodiment of the present invention.

FIG. 1 is a block diagram of a receiver 10 for a wireless telecommunications system, such as cellular communications system, according to an embodiment of the present invention. The receiver 10 has particular application for a cellular base station, and has an advantage over those receivers known in the art because it is capable of processing multiple received signals simultaneously at any particular time, as opposed to a single received signal. As will be discussed in detail below, the various components and devices in the receiver 10 are designed to process signals over a relatively wide frequency band so that multiple signals transmitted at different carrier frequencies can be processed simultaneously. Thus, the receiver hardware in the base station can be limited accordingly.

Transmitted signals are received by an antenna 12 in the receiver 10. The signals received by the antenna 12 are applied to a duplexer 14 that only passes the signals in a particular receive frequency band of interest. The function and operation of the duplexer 14 is well understood to those skilled in the art. Different frequency bands may be used by different telecommunications systems. In one example, the frequency band of interest has a bandwidth of about 75 MHz centered at 1750 MHz.

According to an embodiment of the present invention, the receiver 10 includes an LNA 16, a frequency down-converter 18, an ADC 20 and a digital channelizer 22 that process the received signals over the wideband. The frequency down-converter 18 includes an LO 26, a mixer 28, an amplifier 30, a BPF 32, an attenuator 34 and a transformer 36. The LO 26 includes an LO frequency reference source 40, a synthesizer 42, first and second amplifiers 44 and 46 and a frequency multiplier 48. Each of the LNA 16, the frequency down-converter 18, the ADC 20 and the digital channelizer 22 are specialized components that operate in connection with each other to pass a relatively wide frequency band, without degrading receiver performance, so that multiple signals can be simultaneously processed by the receiver 10. Specifics of the specialized LNA 16, the ADC 20 and the channelizer 22 will be discussed below.

The band limited signal from the duplexer 14 is applied to the LNA 16 to amplify the low power signal from the antenna 12 to a desired amplitude. In one embodiment, the LNA 16 is optimized for a particular frequency band, for example, 1722.5–1772.5 MHz. The amplified signal from the LNA 16 is applied to the mixer 28 along with an LO signal from the amplifier 44 to down-convert the received signal to a lower frequency. The LO signal is generated by the reference source 40 and is tuned by the synthesizer 42 to a particular center frequency. The output of the mixer 28 is an IF signal suitable for subsequent digital signal processing.

The IF signal is bandpass limited by the BPF 32 to a particular frequency band. In one embodiment, the synthesizer 42 tunes the reference frequency between 1497.5 MHz–1622.5 MHz to generate the IF signal from the mixer 28 at a center frequency of 187.5 MHz, and the BPF 32 passes signals over a 25 MHz frequency band centered at 187.5 MHz. These frequencies are identified by way of non-limiting examples in that other systems may employ other frequency bands within the scope of the present invention. The combination of the mixer 28 and the BPF 32 provide the desired frequency control of the IF signal during the down-conversion step. The other components in the down-converter 18, particularly the amplifier 30, the attenuator 34 and the transformer 36, provide the desired amplitude adjustment of the IF signal. The transformer 36 converts the IF signal into a form suitable for the ADC 20, as is well known in the art.

The ADC 20 provides the necessary speed and device performance to convert the IF signal at the wideband frequency range into a digital signal in a high performance manner. The ADC 20 must simultaneously process both weak and strong signals. In one embodiment, the ADC 20 employs delta-sigma processing, as described in detail later in this description. To allow the ADC 20 to operate in this manner, the LO signal from the synthesizer 42 is used as a timing signal. The frequency of the LO signal is doubled by the multiplier 48, amplified by the amplifier 46, and then applied to the ADC 20. By providing this input to the ADC 20, changes in the synthesizer output do not induce distortions into the analog-to-digital conversion. In other words, the signal from the amplifier 46 to the ADC 20 acts as a clock input at a clock rate determined by the synthesizer 42 for more optimal device performance.

The digitally converted signal from the ADC 20 is then applied to the digital channelizer 22 that separates all of the received signals across the wide bandwidth into the separate signals for subsequent digital signal processing. In other words, all of the adjacent frequency bands in the IF signal passed by the BPF 32 are converted to a digital signal by the ADC 20, and then separated into their respective frequency bands by the channelizer 22. The separated signals can then be processed in the normal manner by subsequent DSP devices (not shown).

Because the performance and operation of the LNA 16, the frequency down-converter 18, and the ADC 20 are optimized for the wide frequency band without inducing distortions to the received signals, the digital channelizer 22 is able to readily separate the signals in the digital domain without adding distortion. In this example, the digital channelizer 22 provides four separate signals. However, this is by way of a non-limiting example, in that other applications may include two outputs, eight outputs, sixteen outputs, etc., within the scope of the present invention.

The cascaded combination of LNA, mixer, filters, and attenuators must maintain high sensitivity and low distortion for a wide range of frequencies and channel power levels. Choice of component parameter values (gain, noise level, linearity) is critical for the multiple channel receiver. Too much gain or insufficient linearity (characterized by input (IIP) or output (OIP) intercept power levels) jeopardizes channel intermodulation. Too little gain or too large component noise threatens receiver sensitivity.

Table I below shows specific components for the receiver 10 and component performance, and Table II gives overall performance of the receiver 10.

TABLE I

| Stage | Component | Gain (db, typ) | NF (db, typ) | IIP (dbm, typ) | OIP (dBm, typ) |
|---|---|---|---|---|---|
| LNA | A1-TRW | 23.0 | 0.35 | 11.0 | 34.0 |
| Mix-1 | HMJ7 | −8.5 | 10.50 | 39.0 | 30.5 |
| Amp-1 | AH3 | 14.0 | 3.00 | 26.0 | 40.0 |
| Flt-1 | MLP__265_3_RA | −3.0 | 3.00 | >103.0 | >100.0 |
| Attn-1 | Attn-3 | −3.0 | 3.00 | >103.0 | >100.0 |
| ADC | DS-ADC | N/A | 12.40 | N/A | N/A |

TABLE II

| Receiver Performer Condition | Min | Typ | Max |
|---|---|---|---|
| Gain (dB) | 20.8 | 22.5 | 23.4 |
| NF (dBm) | 0.81 | 1.03 | 1.44 |
| IIP (dBm) | 6.8 | 7.4 | 8.5 |
| OIP (dBm) | 28.7 | 29.9 | 30.8 |

Figure 2:
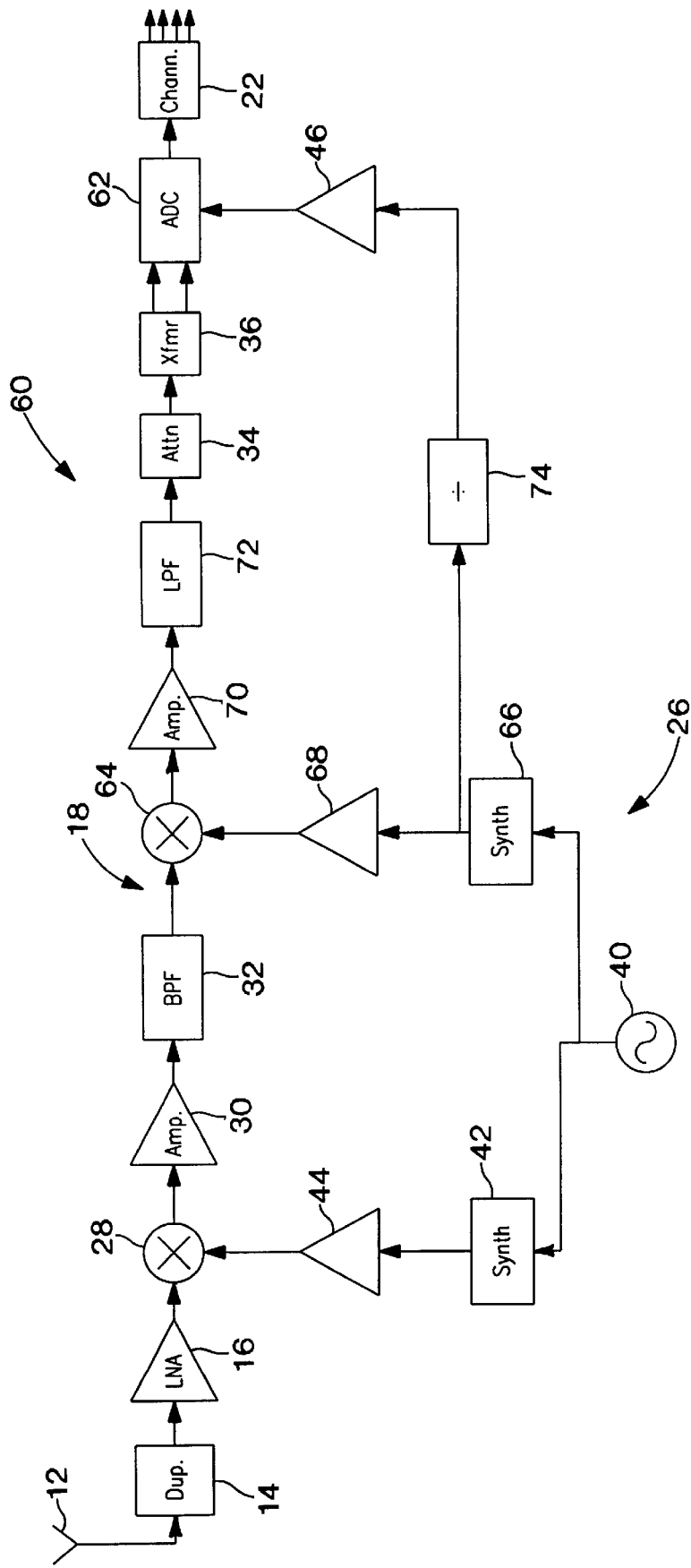
FIG. 2 is a block diagram of a receiver for a wireless telecommunications system capable of processing multiple signals simultaneously, and employing a double frequency down-conversion process, according to another embodiment of the present invention.

FIG. 2 is a block diagram of a receiver 60, similar to the receiver 10 described above, where like components are identified by the same reference numeral and operate in the same manner. The down-converter 18 in the receiver 10 provided a single step down-conversion from the high carrier frequency received by the antenna 12 to the IF signal. In this embodiment, the ADC 20 was complex to provide the necessary digital conversion at the higher IF (187.5 MHz). However, this embodiment provided less receiver hardware, i.e., a single mixer, a single BPF, etc. For the receiver 60, a double frequency down-conversion process is performed by the down-converter 18 to reduce the frequency of the IF signal to a lower frequency so that an ADC 62 can be employed that has a lower center frequency.

In the receiver 60, the synthesizer 42 is tuned so that the IF signal from the mixer 28 is about 228 MHz, and thus may be different than the IF signal from the mixer 28 in the receiver 10. A second mixer 64 is provided after the BPF 32 to further reduce the frequency of the IF signal to about (28 MHz). A synthesizer 66 is provided to tune the mixer 64, and an amplifier 68 is provided to amplify the signal applied to the mixer 64. In this embodiment, the baseband signal is amplified by an amplifier 70 and is passed through a low pass filter (LPF) 72. The frequency multiplier 48 has been replaced with a frequency divider 74 that divides the signal from the synthesizer 66 to provide the clock signal to the ADC 62 through the amplifier 46. The divider 74 is used because the ADC 62 clock has to follow the lower IF. A double frequency down-conversion process is required to center the signal band at 28 MHz with minimal interference from conversion products.

Table III below gives components for the receiver 60 and component performance, where the ADC 62 is a delta-sigma ADC, and Table IV gives overall receiver performance. Table V below gives components for the receiver 60 and component performance, where the ADC 62 is a commercially available ADC, and Table VI gives overall receiver performance.

TABLE III

| Stage | Component | Gain (dB, typ) | NF (db, typ) | IIP (dbm, typ) | OIP (dBm, typ) |
|---|---|---|---|---|---|
| LNA | A1-TRW | 23.0 | 0.35 | 11.0 | 34.0 |
| Mix-1 | HMJ7 | −8.5 | 10.50 | 39.0 | 30.5 |
| Amp-1 | AH3 | 14.0 | 3.00 | 26.0 | 40.0 |
| Flt-1 | BPFxx | −3.0 | 3.00 | >103.0 | >100.0 |
| Mix-2 | HMJ5 | −6.3 | 8.30 | 38.0 | 31.7 |
| Amp-2 | ARJ109 | 10.8 | 4.50 | 33.2 | 44.0 |
| Attn-1 | Attn-7 | −7.0 | 7.00 | >107.0 | >100.0 |
| ADC | DS-ADC | N/A | 12.40 | N/A | N/A |

TABLE IV

| Receiver Performer Condition | Min | Typ | Max |
|---|---|---|---|
| Gain (dB) | 20.9 | 23.0 | 24.4 |
| NF (dB) | 0.88 | 1.13 | 1.61 |
| IIP (dB) | 4.9 | 5.5 | 6.7 |
| OIP (dBm) | 26.8 | 28.5 | 29.7 |

TABLE V

| Stage | Component | Gain (dB, typ) | NF (db, typ) | IIP (dbm, typ) | OIP (dBm, typ) |
|---|---|---|---|---|---|
| LNA | A1-TRW | 23.0 | 0.35 | 11.0 | 34.0 |
| Mix-1 | HMJ7 | −8.5 | 10.50 | 39.0 | 30.5 |
| Amp-1 | AH3 | 14.0 | 3.00 | 26.0 | 40.0 |
| Flt-1 | BPFxx | −3.0 | 3.00 | >103.0 | >100.0 |
| Mix-2 | HMJ5 | −6.3 | 8.30 | 38.0 | 31.7 |
| Amp-2 | ARJ109 | 10.8 | 4.50 | 33.2 | 44.0 |
| Attn-2 | Attn-2 | −2.0 | 2.00 | >102.0 | >100.0 |
| ADC | AD6644 | N/A | 20.30 | N/A | N/A |

TABLE VI

| Receiver Performer Condition | Min | Typ | Max |
|---|---|---|---|
| Gain (dB) | 25.9 | 28.0 | 29.4 |
| NF (dB) | 1.10 | 1.39 | 1.99 |
| IIP (dBm) | 2.8 | 3.6 | 5.0 |
| OIP (dBm) | 30.4 | 31.6 | 32.3 |

Figure 3:
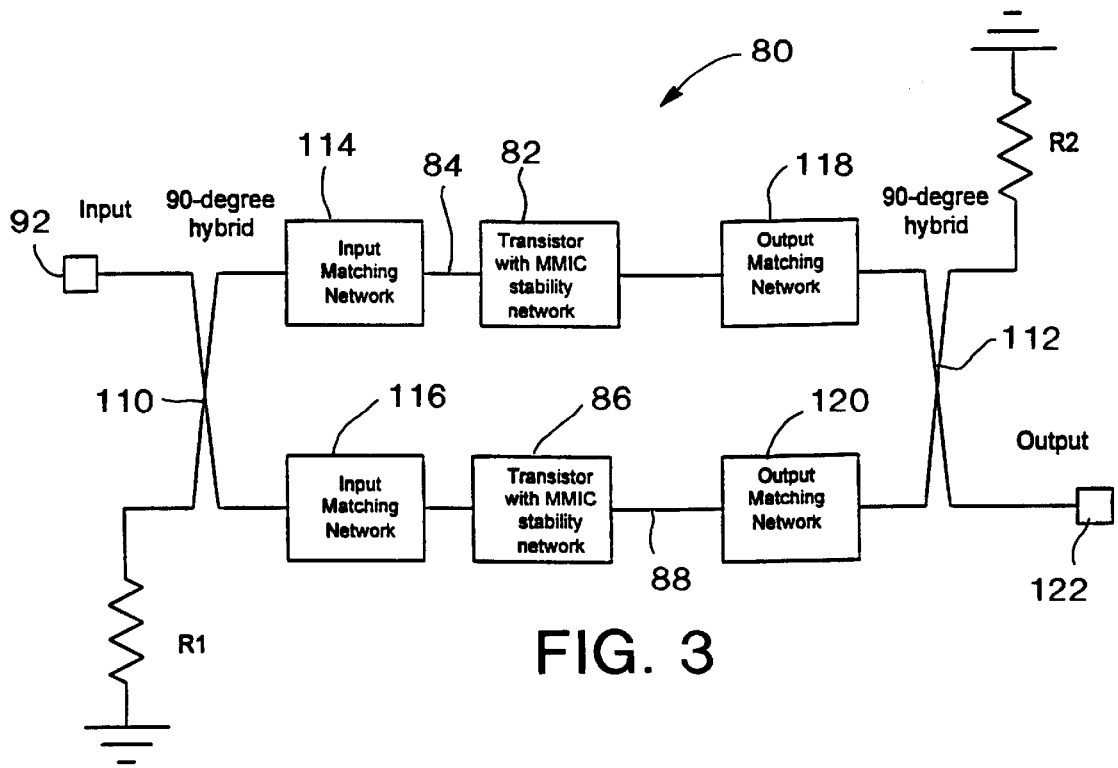
FIG. 3 is a schematic block diagram of a balanced low noise amplifier network that can be used in the receivers shown in FIGS. 1 and 2, according to the invention.
Figure 4:
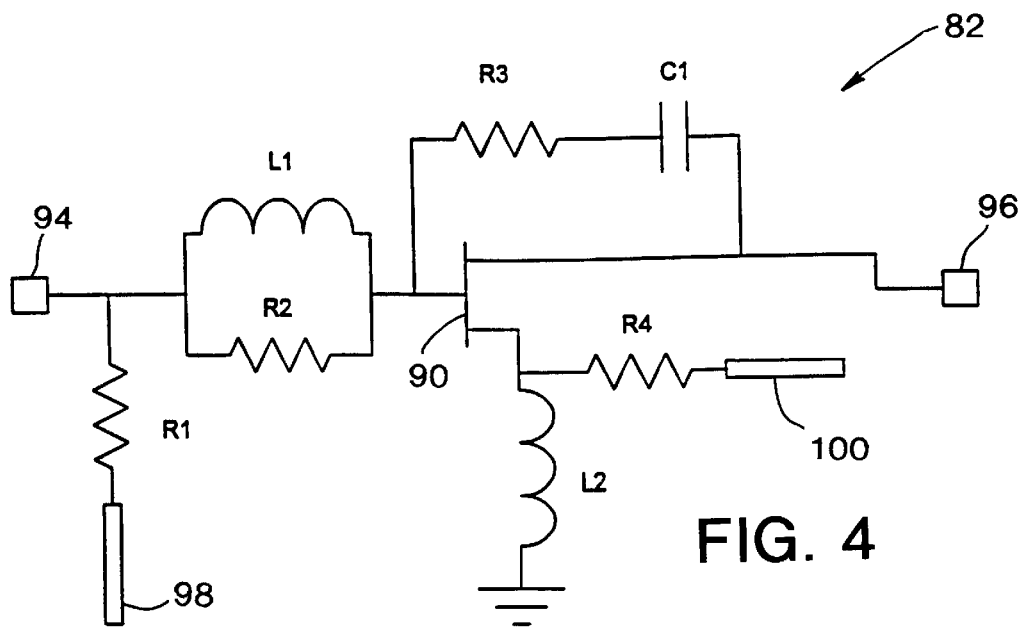
FIG. 4 is a schematic diagram of an MMIC amplifier used in the balanced amplifier network shown in FIG. 3, according to the invention.

FIG. 3 is a schematic block diagram of a balanced amplifier network 80, according to an embodiment of the present invention, that can be used as the LNA 16 discussed above. It is stressed, however, that the network 80 has application for other systems. The basic design of the network 80 is known in the art, and therefore only a cursory discussion of the operation of the network 80 will be given below. The network 80 includes a first amplifier 82 positioned in a first amplification path 84 of the network 80, and a second amplifier 86 positioned in a second amplification path 88 of the network 80. A schematic diagram of the amplifier 82 is shown in FIG. 4, with the understanding that the amplifier 86 is the same. As will be discussed below, the amplifier 82 includes a field effect transistor (FET) 90 and a plurality of oscillation stabilization components that are monolithically integrated in a monolithic microwave integrated circuit (MMIC) on a thin substrate, according to the invention.

The network 80 includes an input 90-degree hybrid coupler 110 and an output 90-degree hybrid coupler 112. The signals from the duplexer 14 are applied to the input terminal 92 of the coupler 110 so that the 0-phase of the input signal is provided on the first path 84 and the 90-degree phase of the input signal is provided on the second path 88. A first input impedance matching network 114 is provided on the first path 84 between the input coupler 110 and the amplifier 82, and a second input impedance matching network 116 is provided on the second path 88 between the input coupler 110 and the amplifier 86. Likewise, a first output impedance matching network 118 is provided on the first path 84 between the amplifier 82 and the output coupler 112, and a second output impedance matching network 120 is provided on the second path 88 between the amplifier 86 and the output coupler 112.

The impedance matching networks 114 and 116 provide the impedance matching desirable for the amplifiers 82 and 86, respectively, to generate the lowest noise figure for the FET 90. The phase difference of the signals on the first and second paths 84 and 88 provide the desired cancellation of the signal reflections to provide the impedance matching at the input terminal 92. The output matching networks 118 and 120 provide the impedance matching for the linearity of the FET 90. The output coupler 112 combines the output power for both of the amplifiers 84 and 88 on the output terminal 122.

By providing a short gate length, the FET 90 is a high frequency amplifier capable of amplifying signals up 80–100 GHz. Because the FET 90 is able to amplify signals at very high frequencies with low noise and good output power, it is desirable for the wide bandwidth, low noise application for the receivers 10 and 60. But, the network 80 is designed to amplify signals at about 2 GHZ for the cellular transmission application. Thus, there is a concern that the FET 90 may oscillate at the higher frequencies (above 5 GHZ), which will degrade device performance. Small changes in impedance at the input and output of the FET 90 cause high frequency instability in the FET 90, that creates the high frequency oscillations. To prevent the high frequency oscillations, it is necessary to be concerned about the connections around the FET 90, and provide stabilization components connected to the FET 90 on the same substrate.

The amplifier 82 includes an input port 94 and an output port 96. A large resistor R3 and a capacitor C1 are connected between the gate and drain terminals of the FET 90. The resistor R3 and the capacitor C1 reduce gain at low frequencies, and help prevent the amplifier gain from getting high at low frequencies. Further, an inductor L1 and a resistor R2 are connected in parallel with each other and between the input port 94 and the gate terminal of the FET 90. As the reactance of the circuit goes up as the frequency goes up, the resistor R2 becomes a high loss device that acts to limit the gain of the FET 90 at the high frequencies. The inductor L1 is very low inductance, so it only works at high frequencies and will pass signals at low frequency. Also, a resistor R1 and an open-ended transmission line 98 are connected in series with each other and to the input port 94. As the frequency increases, the transmission line 98 becomes low impedance, so that current can flow through the resistor R1 providing a shunt load on the input port 94 at high frequencies to reduce the gain of the FET 90 at these frequencies. An inductor L2 is connected to the source terminal of the FET 90, and is used to improve the input match for low noise amplifiers. A resistor R4 and an open end transmission line 100 are connected to the source terminal, and operate in the same manner as the resistor R1 and the transmission line 98 for the source terminal. At low frequencies, the resistor R4 acts as an open circuit. As the frequency increases, the transmission line 100 becomes low impedance, so that current will flow through the resistor R4, providing a reduction in the Q of L2.

The particular circuit configuration of the stabilization components discussed above is shown by way of a non-limiting example in that other circuit configurations can be used to provide the desired stabilization at high frequency, as would be appreciated by those skilled in the art. One of ordinary skill in the art would understand the operation of the stabilizing components discussed herein, and would know what component values would be needed for proper device operation.

As discussed above, the oscillation stabilization components prevent the amplifier from amplifying above a certain frequency, and thus oscillations do not occur at these frequencies. A problem exists in this approach for amplifier 80. The short wavelengths at higher frequencies cause the stabilization components implemented on a thick substrate to become unpredictable. As the frequency gets higher, the substrate thickness must get smaller for the stabilization components to have predictable operation in achieving the desired stabilization. As the thickness of the substrate increases, the components behave in a less predictable manner. However, for thin substrates, the transmission lines need to be narrow for proper device impedance matching. But, narrow transmission lines have a high resistance, which significantly increases loss. Therefore, it is undesirable to include all of the components of the amplifier network 80 on a thin substrate because the losses would be unacceptable.

According to the present invention, the FET 90 and the stabilization components R1, R2, R3, R4, C1, L1, L2, and the transmission lines 98 and 100 are monolithically integrated on a thin substrate as an MMIC, and the other components of the network 80 are integrated on a thick substrate as a microwave integrated circuit (MIC). Because the MMIC amplifiers 82 and 86 are very small, the losses in these devices are not significant. In one embodiment, the substrate for the amplifiers 82 and 86 is about 4 mils, and the substrate for the other components in the network 80 is about 20–50 mils. The substrate material can be GaAs, InP, or any other suitable semiconductor material.

Figure 5:
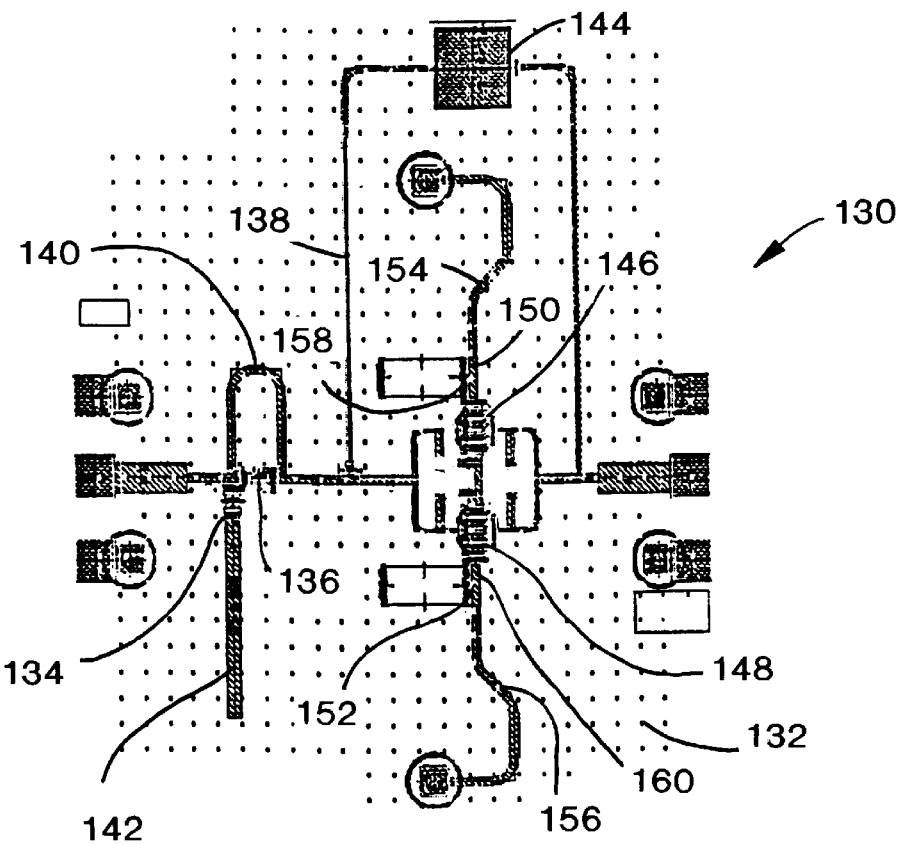
FIG. 5 is a component layout diagram of the amplifier shown in FIG. 4.

FIG. 5 is a circuit plan view of an amplifier 130, representing the amplifier 82, to show the monolithically integrated location of the components discussed above on a monolithic substrate 132. In this embodiment, the substrate 132 is GaAs. Particularly, the resistor R1 is shown at location 134, the resistor R2 is shown at location 136, the resistor R3 is shown at location 138, the inductor L1 is shown at location 140, the transmission line 98 is shown at location 142, and the capacitor C1 is shown at location 144. In this design, the FET 90 is two FETs 146 and 148 connected in parallel. Therefore, the transmission line 100 includes transmission lines 150 and 152, the inductor L2 includes inductors 154 and 156, and the resistor R4 includes resistors 158 and 160.

Figure 6:
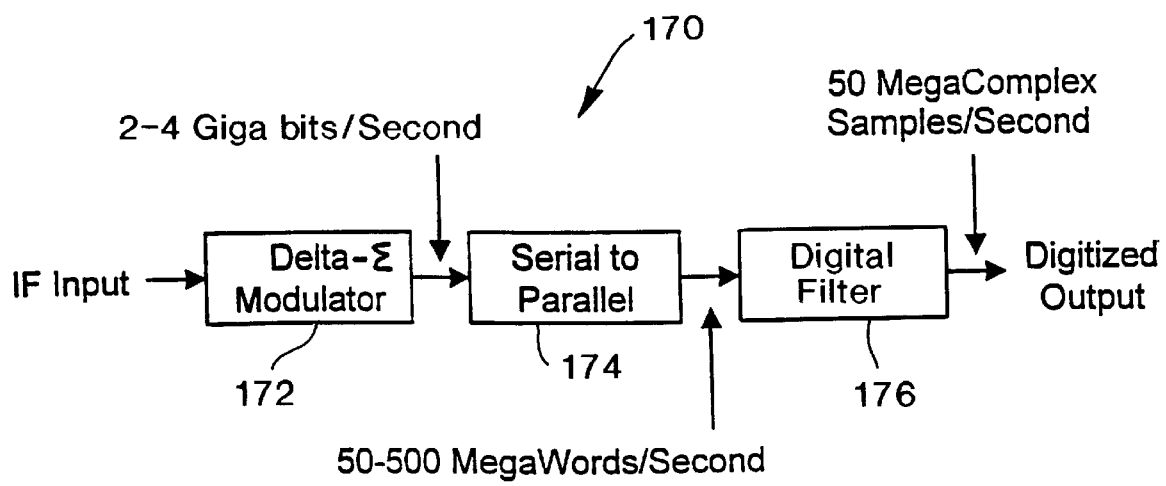
FIG. 6 is a block diagram of a delta-sigma analog-to-digital converter that can be used in the receivers shown FIGS. 1 and 2, according to the invention.

FIG. 6 is a block diagram of an ADC 170 that can be used as the ADC 20 and 62 above. The ADC 170 includes a delta-sigma modulator 172 that receives the analog signal from the down-converter 18 and generates a representative stream of digital data at a very high clock rate, in a manner that will be discussed in detail below. The stream of digital data from the delta-sigma modulator 172 is sent to a serial-to-parallel converter 174 that de-multiplexes the delta samples to a word rate that is compatible with a CMOS processor. A digital filter 176 receives the digital data at the lower clock rate, and filters the signal to provide sixteen bit words suitable for the channelizer 22.

FIG. 7 is a block diagram of the delta-sigma modulator 172. The delta-sigma modulator 172 includes a summation device 180 that receives the analog signal from the down-converter 18 and a negative feedback signal from the digital output of the modulator 172. The analog difference signal from the summation device 180 compensates for the error in the digital output of the modulator 172. The error is the difference between the input and the output of the modulator. By determining this error, the difference between the input and the output can be directed to zero or minimized for increased conversion accuracy.

The difference signal from summation device 180 is applied to a filtering device 182 having a predetermined filter function that identifies the operational characteristics of the modulator 172. The filter function looks at the difference error signal and generates a voltage that amplifies the frequencies of interest in the error signal. The filtered error signal is applied to a sample and hold device 184 that samples the analog signal for a predetermined period of time, and provides a stable output voltage at the end of each hold period. The analog signal from the sample and hold device 184 is applied as an input to a comparator 186 that compares the analog signal to a threshold, here zero, and provides either a high or low logic output at each clock cycle f. The high or low output represents a data bit. The output of the comparator 186 is a stream of digital data that is very fast, 2–4 gigabits/second.

One of the problems with using the comparator 186 in this manner is the inherent inability of the comparator 186 to accurately convert the analog signal to a digital signal because the analog signal is rapidly changing. In other words, the rapidly changing analog signal limits the ability of the comparator 186 to accurately determine the proper digital output. According to the invention, the sample and hold device 184 provides the ability to accurately track the output of the filtering device 182, and hold the last voltage tracked for some period of time, to allow the input to the comparator 186 to be more stable. An example of a sample and hold device that can be used for this purpose can be found in U.S. Pat. No. 4,370,572, titled Differential Sample-And-Hold Circuit.

The digital output from the comparator 186 is used as a feedback signal in the delta-sigma modulator loop. The comparator 186 provides either a logical 1 state or a logical 0 state. In practice, the output is a high or low voltage representing the logical state. Energy coupling from the input of the comparator 186 to the output of the comparator 186 creates an uncertainty in the output voltage, where the output voltage may not be the exact output desired. To correct for this uncertainty, according to the invention, a differential limiting amplifier 188 is provided to remove the small fluctuations in the output voltage of the comparator 186 that define the logical 1 or the logical 0. The output of the amplifier 188 does not have the fluctuations in voltage that the input voltage may have.

The stable signal from the amplifier 188 is applied to a digital-to-analog converter (DAC) 190 that coverts the digital feedback signal to an analog signal to be subtracted from the analog input signal in the summation device 180. In one embodiment, the DAC 190 is switched off during the time period that the comparator 186 is making its comparison to further reduce the effects of comparator output variations on the feedback signal.

In an alternate embodiment, the modulator 172 may include more than one comparator 186, where the analog signal from the filtering device 182 is applied to all of the comparators in parallel, and each comparator compares the signal against a different threshold. Each comparator would include a separate differential amplifier and DAC, and all of the signals from the DACs would be added to the summation device 180.

The sample and hold device 184 and the limiting amplifier 188 are not required for operation of the modulator 172. However, employing these components, either singly or in combination, allows the modulator 172 to operate more accurately at higher clock rates. Thus, the modulator 172 increases the accuracy of the analog-to-digital conversion for simultaneously processing multiple signals in the receivers 10 and 60, as discussed above.

The modulator 172 discussed above included the differential limiting amplifier 188 in the feedback path. In alternate embodiments, the differential limiting amplifier 188 can be provided in the comparator 186, or at other locations in the modulator 172. FIGS. 8(a)–8(c) show various versions of this embodiment. In these figures, comparators 200, 202 and 204 are shown including a pre-amplifier 206 and a flip flop 208, including a master latch 210 and a slave latch 212. A differential limiting amplifier 214 is shown in different locations, including between the latches 210 and 212 (FIG. 8(a)); between the pre-amplifier 206 and the master latch 210 and between the latches 210 and 212 (FIG. 8(b)); and between the pre-amplifier 206 and the master gate 210, between the gates 210 and 212, and after the slave gate 212 (FIG. 8(c)).

Figure 9B:
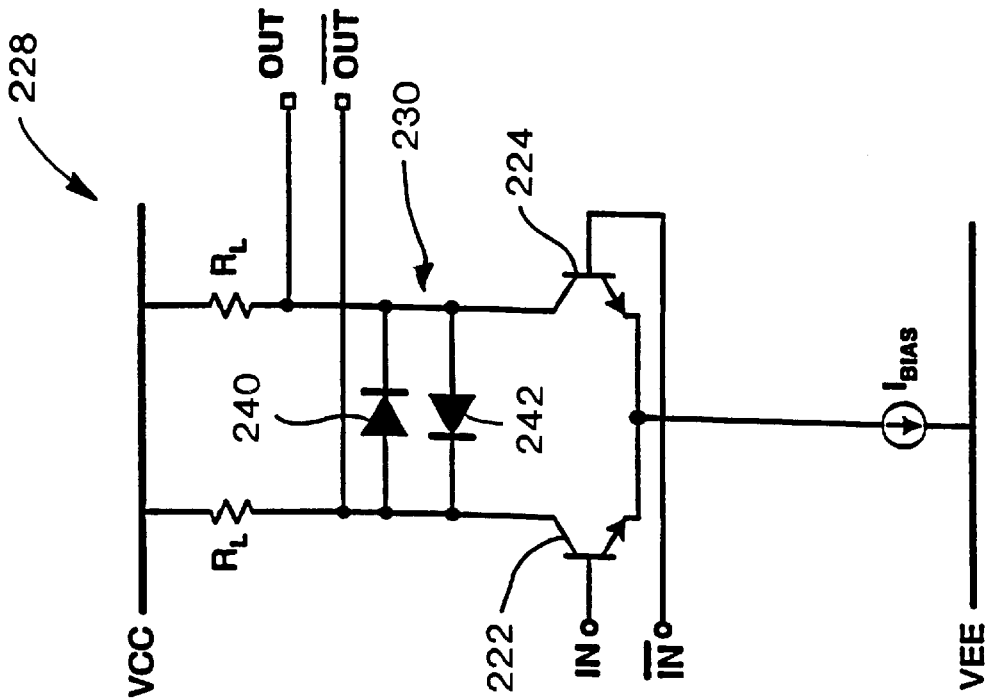
FIGS. 9(a)–9(b) are schematic diagrams of various differential limiting amplifiers than can be used in the delta-sigma modulators shown in FIGS. 7–8(c), according to the invention.
Figure 9A:
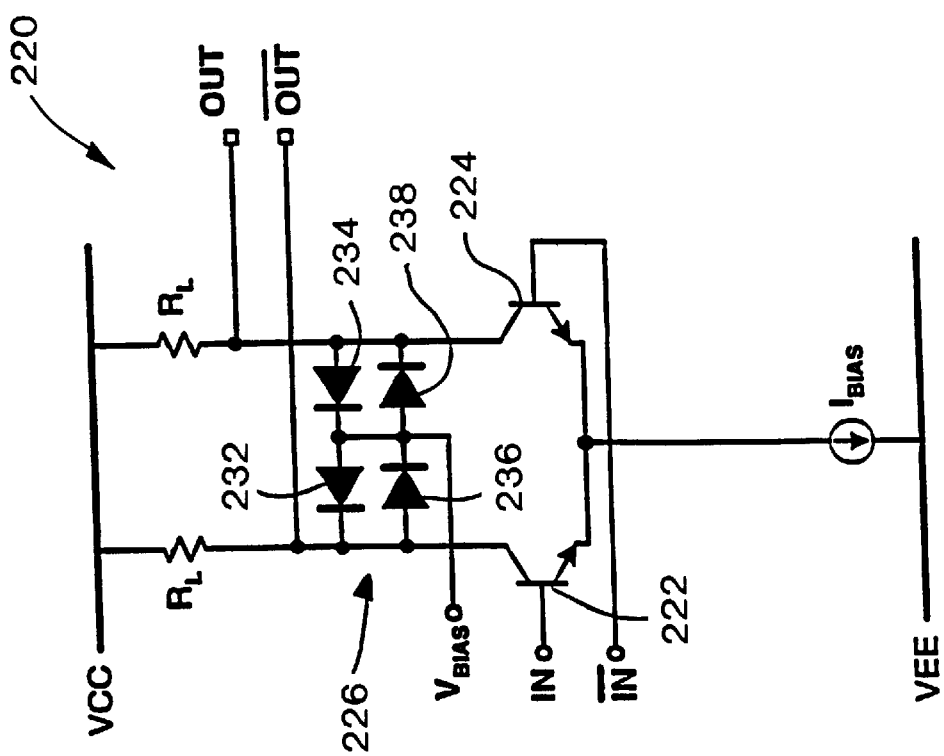

Schematic diagrams of different embodiments of a differential limiting amplifier suitable for the purposes discussed herein are shown in FIGS. 9(a) and 9(b). FIG. 9(a) shows a differential limiting amplifier 220 including differential pair transistors 222 and 224, and including a Schottky diode clamp 226 having Schottky diodes 232–238 connected between the collector terminals of the transistors 222 and 224. As is apparent, the Schottky diode clamp 226 consists of two sets of diode pairs. Each diode pair is connected in a series arrangement with the midpoint connection tied to a low impedance voltage source, for example, ground. The diode pairs are connected across the load resistors $R_L$ of the differential amplifier 220 in an anti-parallel fashion. This arrangement insures that when the diodes 232–238 turn on, the voltage at each differential output clamps in a symmetrical fashion, i.e., one diode forward drop above the midpoint voltage and one diode forward drop below the midpoint voltage. Thus, the output nodes of the amplifier 220 are held at a low impedance. When the input voltage of the limiting amplifier 220 reverses polarity, the alternate pair of diodes turn on, again maintaining symmetry and low impedance.

FIG. 9(b) shows a differential amplifier 228 including the transistors 222 and 224, and including a Schottky diode clamp 230 comprising Schottky diodes 240 and 242 connected between the collector terminals of the transistors 222 and 224. The amplifier 228 operates in the same manner as the amplifier 220.

Figure 10:
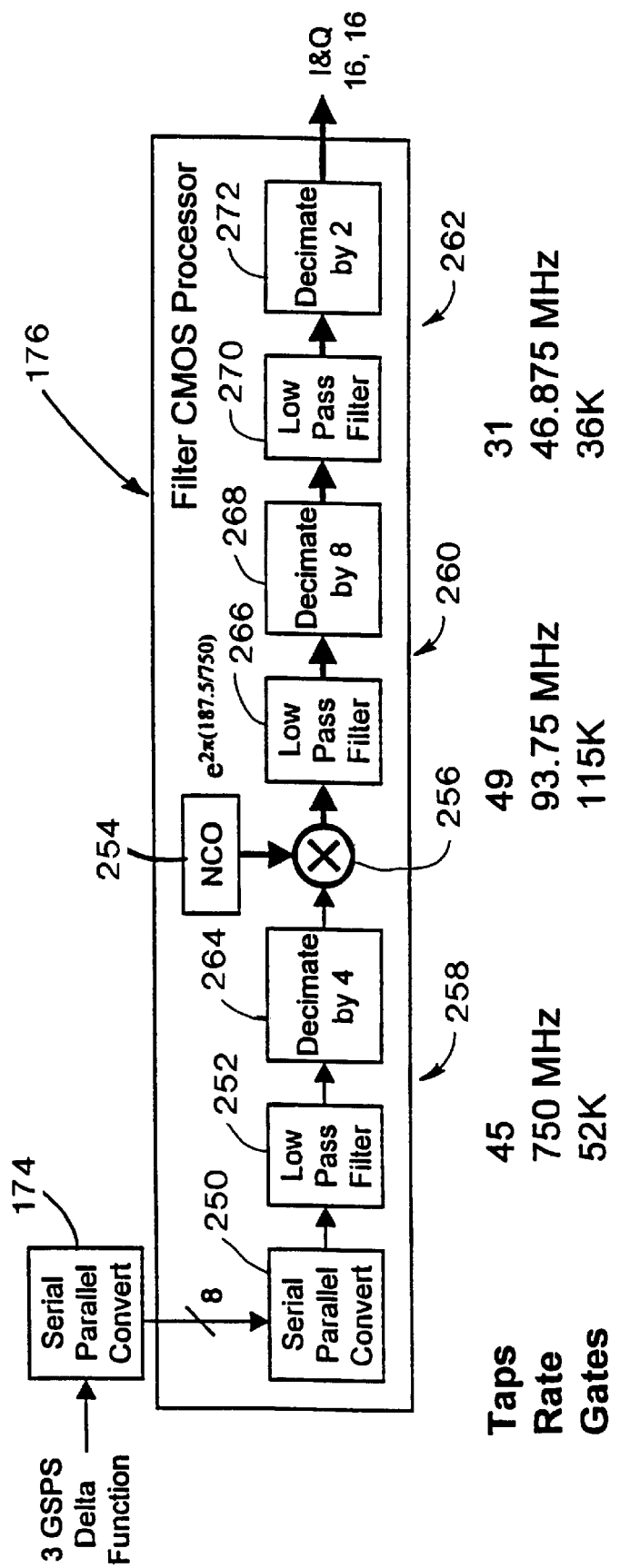
FIG. 10 is a block diagram of the digital filter used in the analog-to-digital converter shown in FIG. 6, according to the invention.

Turning now to FIG. 10, the digital filter 176 will be described in greater detail. Generally, the filter 176 has a serial-to-parallel conversion module 250, a numerically controlled oscillator (NCO) 254, a digital mixer 256, and a plurality of filter and decimate stages 258, 260 and 262. The NCO 254 generates a frequency conversion signal based on a desired center frequency. In the illustrated example, the frequency conversion signal is equivalent to a sinewave having a 187.5 MHz frequency. The digital mixer 256 has a first input code to the NCO 254 for mixing the individual carrier signals with the frequency conversion signal. The filter and decimate stages 258, 260, and 262 digitally filter each bit stream from the serial-to-parallel conversion module 250 based on a desired bandwidth.

Specifically, it can be seen that a first stage 258 is coupled to the serial-to-parallel conversion module 250. The output of the serial-to-parallel conversion module 250 is a low speed version of the output of converter 174. This enables the filter 176 to be implemented with a standard CMOS process. The first stage 258 is also coupled to a second input of the digital mixer 256, and essentially removes high frequency noise energy content from the digital data. The second stage 260 is coupled to an output of the digital mixer 256, and removes the remaining out-of-band noise and spurious energy content from the digital data. In one embodiment, a third stage 262 is coupled to the second stage 260 to further remove out-of-bound energy content from the digital data. It is important to note that each stage results in less data, and therefore allows slower sample rates. This makes arithmetic processing easier and reduces overall system costs.

Generally, each stage 258, 260 and 262 has a low pass filter and a decimation module. For example, the first stage 258 includes low pass filter 252 and decimation module 264. The decimation module 264 is coupled to the low pass filter 252 for decimating the digital data by a factor. The decimation module 264 decimates by a factor of four. This means that three out of every four samples are removed, resulting in one-fourth of the incoming amount of data. The second stage 260 has a low pass filter 266 and a decimation module 268. The decimation module 268 decimates by eight. Similarly, the third stage includes low pass filter 270 and decimation module 272, where the decimation module 272 decimates by two. In each stage, increase in word length accompanies the decimation in order to preserve the full in-band information content. The numerical coefficients of the low pass filters 252, 266 and 270 can be selected to provide the desired multi-channel bandwidth. It is also important to note that the center frequency of the NCO 254 is tunable to optimize the dynamic range of the A/D converter 176.

Figure 11:
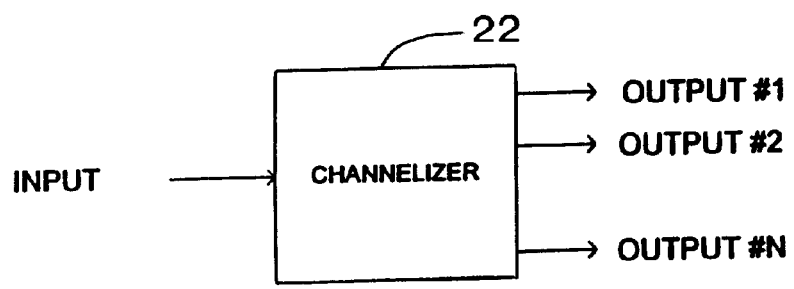
FIG. 11 is a block diagram of a digital channelizer that can be used in both the receivers shown in FIGS. 1 and 2, according to the invention.
Figure 14:
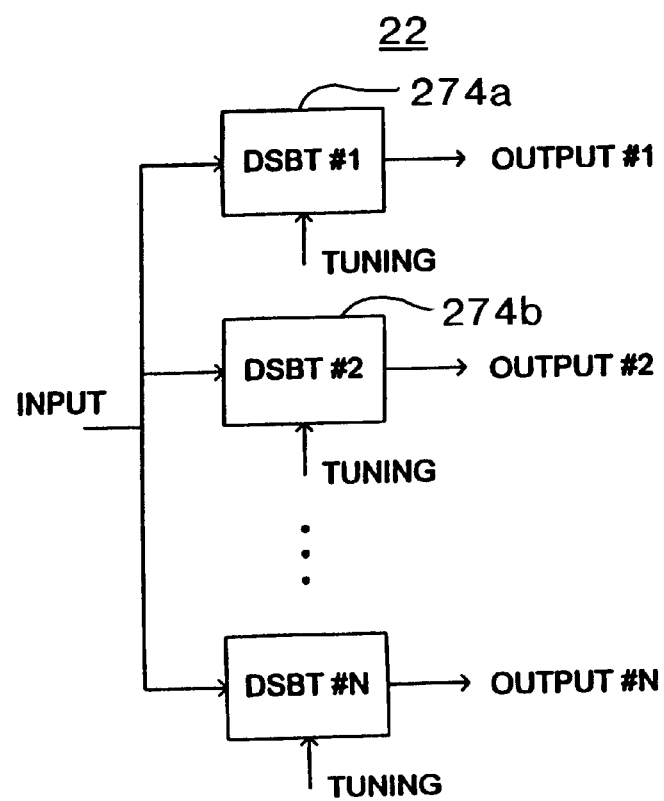
FIG. 14 is a block diagram of a channelizer including an array of sub-band tuners, according to another embodiment of the present invention.

FIGS. 11–14 show various embodiments of the channelizer 22 in greater detail. The channelizer 22 may be implemented as a Fast Fourier Transform (FFT), an array of quadrature mirror filters, a filter tree, or an array of digital sub-band tuners (DSBTs). Specifically, FIGS. 11 and 14 show that the preferred channelizer 22 has a plurality of DSBTs 274. Each DSBT 274 digitally filters individual carrier signals from a digital multi-carrier signal based on a programmable center frequency $f_c$. The specifics of each DSBTs 274 can be seen in FIG. 10. With continuing reference to FIG. 14, it will be appreciated that each DSBT 274 also digitally filters the individual carrier signals based on a programmable bandwidth. Thus, all of the remaining in-band content from the A/D converter 20 is routed to the DSBTs 274.

The DSBTs 274 can be allocated based on frequency or modulation format. For example, the first DSBT 274a could digitally filter individual carrier data streams having a first modulation format (e.g., CDMA), and a second DSBT 274b could digitally filter individual carrier data streams having a second modulation format (e.g., GSM). An FFT could also be used to efficiently extract carriers and bands with a large number of regularly spaced carriers. The quadrature and tree filter structures provide the ability to efficiently implement channelizers with fixed channels of differing bandwidths. As already discussed, DSBTs permit programmable channel bandwith and center frequency use. It will further be appreciated that each channelizer 22 may be implemented as logic elements on integrated circuits, or as programmable digital signal processors as required to achieve the desired bandwidths with the integrated circuit technology used.

Figure 12:
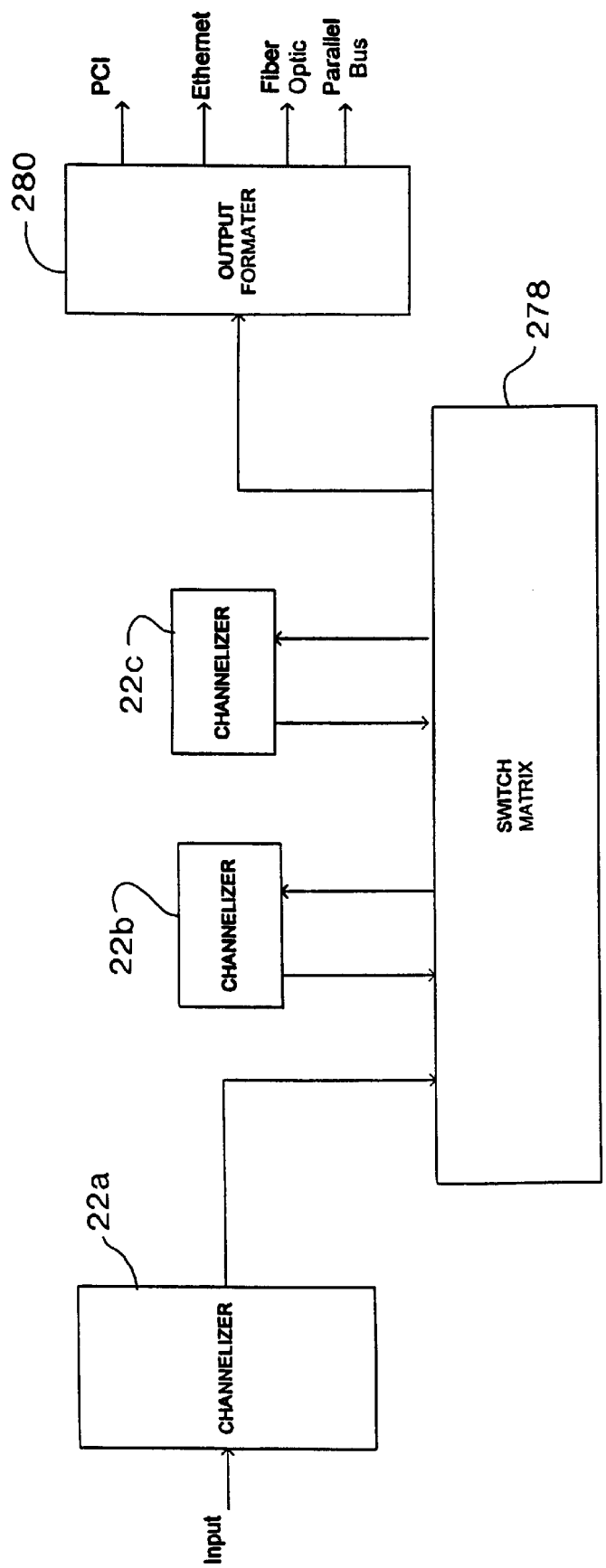
FIG. 12 is a block diagram of a reconfigurable channelizer, according to another embodiment of the present invention.

FIG. 12 shows a first alternative embodiment, wherein a plurality of channelizers 22 are interconnected by a switch matrix 278. This permits arbitrary interconnection of the channelizers 22 to provide an optimum utilization of resources. The number of channelizers available, and the size of the switch matrix 278 are determined by the number and types of signals to be extracted. Channelizers of differing types, speeds, channel capacity, and accuracy can be included to optimize efficiency. An output formatter 280 arranges the extracted channels into one or more output data streams of one or more formats. Formats might be peripheral component interface (PCI) or other parallel interfaces. Formats may also be serial interfaces such as Ethernet, IEEE 1553, or IEEE 1394. Essentially, any interface used in computer applications or communications systems utilizing wire, optical fiber, optical, or wireless RF as media represent suitable formats. Buffer storage is included to permit the use of packet switched interface protocols or other protocols that do not provide a uniform flow of data. Furthermore, the output interface of the formatter 280 might serve as a gateway to other circuitry on a common assembly, to a backplane of a computer or other similar equipment, or to a network interface. Such a network interface would permit the distribution of each or all of the extracted signals to one or more destinations.

Figure 13:
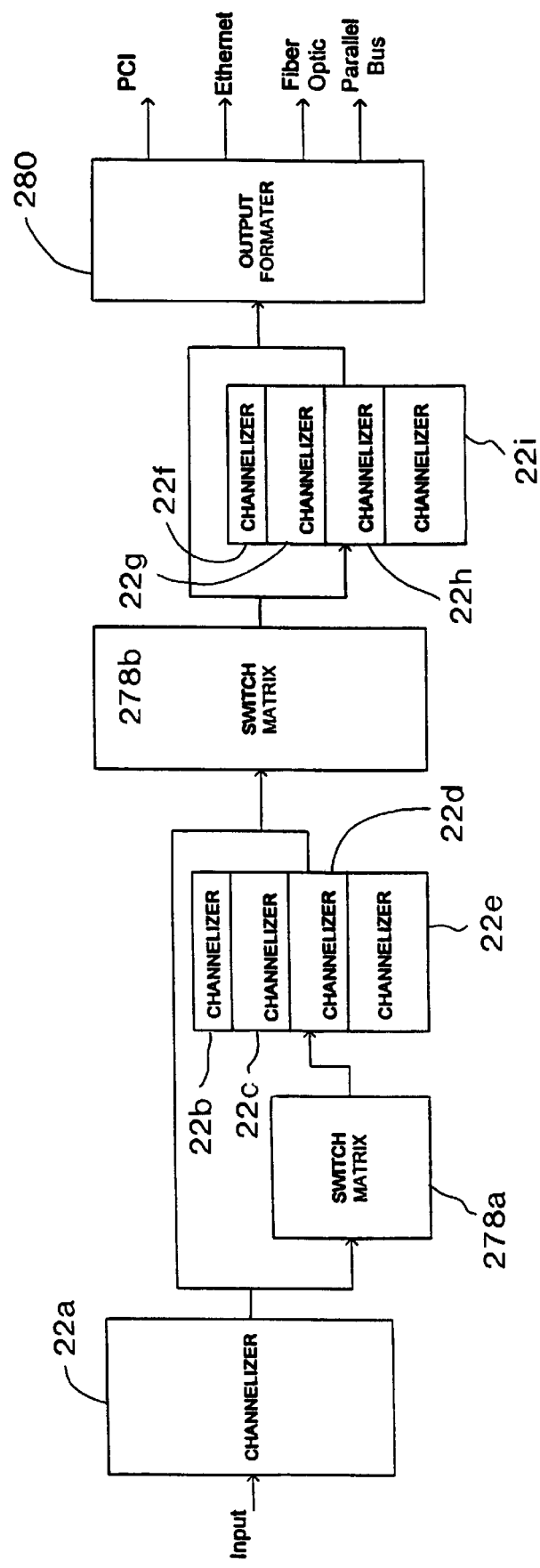
FIG. 13 is a block diagram of a cascaded channelizer, according to another embodiment of the present invention.

Turning now to FIG. 13, a second alternative approach to the channelizer 22 is shown. In this embodiment, a plurality of channelizers 22 are cascaded through switch matrices 278 to permit sub-channelization. Thus, an initial channelizer 22a might select bands of specific formats, while subsequent channelizers 22b–22i would extract carriers within a band. As already discussed, each channelizer 22 can be individually tuned to any band for multi-carrier types or additional channels. Furthermore, FFT or quadrature/tree filter channelizer bandwidth and center frequency can be changed to accommodate different formats by varying the clock rate and input bandwidth from the preceding channelizer.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope the invention as defined in the following claims.

What is claimed is:

1. An analog-to-digital converter comprising:
   a delta-sigma modulator responsive to an analog input signal and generating an output including a stream of digital data bits at high frequency, said delta-sigma modulator including a summation device, a modulation filter defining the operational characteristics of the modulator, at least one comparator and a feedback digital-to-analog converter (DAC) positioned in a feedback loop of the modulator, said feedback DAC feeding an analog representation of the stream of digital data bits to the summation device said summation device subtracting the output of the DAC from the analog input signal, said delta-sigma modulator further including at least one differential limiting amplifier for stabilizing the output of the comparator; and a digital filter responsive to the stream of digital data bits, said digital filter generating a series of digital words at a lower data rate;

and wherein the at least one differential limiting amplifier is located in the comparator.

2. The analog-to-digital converter according to claim 1 wherein the at least one differential limiting amplifier is positioned between a master latch and a slave latch in the comparator.

3. The analog-to-digital converter according to claim 2 wherein the at least one differential amplifier is two differential amplifiers, where a first differential limiting amplifier is positioned between a pre-amplifier and the master latch in the comparator and a second differential limiting amplifier is positioned between the master latch and the slave latch in the comparator.

4. The analog-to-digital converter according to claim 3 wherein the at least one differential limiting amplifier is three differential limiting amplifiers, where a third differential amplifier is positioned after the slave latch.

5. An analog-to-digital converter comprising:

a delta-sigma modulator responsive to an analog signal and generating an output including a stream of digital data bits at high frequency, said delta-sigma modulator including a summation device, a modulation filter defining the operational characteristics of the modulator, at least one comparator and a feedback digital-to-analog converter (DAC) positioned in a feedback loop of the modulator, said feedback DAC feeding an analog representation of the stream of digital data bits to the summation device, said summation device subtracting the output of the DAC from the analog input signal, said delta-sigma modulator further including a sample and hold circuit, said sample and hold circuit receiving a signal from the modulation filter and sampling the signal from the filter over a predetermined time period, said sample and hold circuit providing a held voltage, said comparator being responsive to the held voltage from the sample and hold circuit and generating the stream of digital data bits from the held voltage; and a digital filter responsive to the stream of digital data bits, said digital filter generating a series of digital words at a lower data rate;

wherein said delta-sigma modulator further includes at least one differential limiting amplifier for stabilizing the output of the comparator;

wherein the at least one differential limiting amplifier is located in the comparator, and wherein the at least one differential limiting amplifier is positioned between a master latch and a slave latch in the comparator.

6. The analog-to-digital converter according to claim 5 wherein the at least one differential limiting amplifier is two differential amplifiers, where a first differential limiting amplifier is positioned between a pre-amplifier and the master latch in the comparator and a second differential limiting amplifier is positioned between the master latch and the slave latch in the comparator.

7. The analog-to-digital converter according to claim 6 wherein the at least one differential limiting amplifier is three differential limiting amplifiers, where a third differential-amplifier is positioned after the slave latch.

8. An analog-to-digital converter comprising:

a delta-sigma modulator responsive to an analog input signal and generating an output including a stream of digital data bits at high frequency, said delta-sigma modulator including a summation device, a filter, at least one comparator and a feedback digital-to-analog converter (DAC), said feedback DAC feeding an analog representation of the stream of digital data bits to the summation device, said summation device subtracting the output of the DAC from the analog input signal, said delta-sigma modulator further including at least one differential limiting amplifier for stabilizing the output of the comparator, said at least one differential limiting amplifier being located in the comparator: and a digital filter responsive to the stream of digital data bits, said digital filter generating a series of digital words at a lower data rate;

and wherein the at least one differential limiting amplifier is positioned between a master latch and a slave latch in the comparator.

9. The analog-to-digital converter to claim 8 wherein the at least one differential limiting amplifier is two differential amplifiers, where a first differential limiting amplifier is positioned between a pre-amplifier and the master latch in the comparator and a second differential limiting amplifier is positioned between the master latch and the slave latch in the comparator.

10. The analog-to-digital converter according to claim 9 wherein the at least one differential limiting amplifier is three differential limiting amplifiers, where a third differential amplifier is positioned after the slave latch.

* * * * *